(12) United States Patent
Fukuda et al.

(10) Patent No.: US 7,245,188 B2
(45) Date of Patent: Jul. 17, 2007

(54) LIGHT RECEIVING AMPLIFICATION CIRCUIT

(75) Inventors: Hideo Fukuda, Kyoto (JP); Kenji Imaizumi, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 138 days.

(21) Appl. No.: 11/266,323

(22) Filed: Nov. 4, 2005

(65) Prior Publication Data

US 2006/0103472 A1 May 18, 2006

(30) Foreign Application Priority Data

Nov. 18, 2004 (JP) ............... 2004-334146

(51) Int. Cl.
*H03F 3/08* (2006.01)

(52) U.S. Cl. ................... 330/308; 250/214 A
(58) Field of Classification Search ........ 330/308, 330/51, 252, 254, 261; 250/214 A
See application file for complete search history.

(56) References Cited

U.S. PATENT DOCUMENTS 6,833,762 B2 * 12/2004 Seetharaman et al. ...... 330/308

6,849,845 B2 * 2/2005 Lauffenberger et al. .................. 250/214 SW
6,933,786 B1 * 8/2005 Mohandas et al. .......... 330/308

FOREIGN PATENT DOCUMENTS

JP 3142214 12/2000

OTHER PUBLICATIONS

English Language Abstract of JP 3142214, Nov. 1996.

* cited by examiner

*Primary Examiner*—Henry Choe
(74) *Attorney, Agent, or Firm*—Greenblum & Bernstein, P.L.C.

(57) ABSTRACT

A light receiving amplification circuit according to the present invention includes: a light receiving element; an amplification circuit which amplifies a photoelectric current generated by the light receiving element and outputs from an amplification stage for external output and a plurality of amplification stages for feedback; an operating current source set in each of the amplification stages which supplies an operating current to the corresponding amplification stages; a gain selection switch set in the respective plurality of amplification stages for feedback, which interrupts the operating current between the corresponding amplification stage and the operating current source; and a gain resistor set in the respective plurality of amplification stages for feedback and connected between the operating current side of the corresponding gain selection switch and an input of the amplification circuit.

8 Claims, 8 Drawing Sheets

LIGHT RECEIVING AMPLIFICATION CIRCUIT

BACKGROUND OF THE INVENTION (1) Field of the Invention

The present invention relates to a light receiving amplification circuit used primarily in a pickup of an optical disc.

(2) Description of the Related Art

In recent years, optical disc apparatuses able to reproduce and record information have become widespread.

In such an optical disc apparatus, the optical power of a laser differs between when recording and when reproducing. Therefore, a light receiving amplification circuit utilized in signal readout of an optical disc must switch the gain resistor of the operational amplifier and keep the output voltage within the output dynamic range of the amplification circuit when converting a light signal to an electrical signal and further amplifying that electrical signal.

One example of a light receiving amplification circuit which has a gain switching function is disclosed in, for example, Japanese Patent No. 3142214. This light receiving amplification circuit is shown in FIG. 1. In this example, a gain resistor in the operational amplifier which amplifies the output of a light receiving element 801 connected in an anode common is switched with a PNP transistor 807.

The output of the light receiving element 801 is connected to the input of an operational amplifier circuit made up of NPN transistors 803 and 804, and two gain resistors 805 and 806. The gain resistor 806 is directly connected to the output of the operational amplifier, and the other gain resistor 805 is connected to the collector of the PNP transistor 807. An emitter of the PNP transistor 807 is connected to the output of the operational amplifier circuit.

A base of the PNP transistor 807 is connected to a constant current source 810, and the on/off of the PNP transistor 807 is controlled with a switch 811.

In the abovementioned circuit configuration, because the PNP transistor 807 is controlled to be off during reproduction where the laser's optical power is low, the gain of the operational amplifier circuit is set by the gain resistor 806 only.

On the other hand, the PNP transistor 807 is on during recording where the laser's optical power is high, and the gain of the operational amplifier is set by a parallel connection of the gain resistor 805 and the gain resistor 806.

In this manner, the operational amplifier operates with a high gain value during reproduction when the photoelectric current inputted to the operational amplifier is low, and a low gain value during recording when the photoelectric current inputted to the operational amplifier is high. Therefore, stable operation, in which the output of the operation amplifier is not saturated even if the laser power changes drastically, is possible.

However, in the abovementioned conventional configuration, in the case where the PNP transistor 807 is on, there are situations where, in addition to the voltage arising in both ends of the gain resistor 805, a saturation collector-to-emitter voltage Vce (sat) of the PNP transistor enters in between the input terminal and the output terminal of the operational amplifier. Therefore, there is a problem in which the gain of the operational amplifier differs from the designed value and desirable operational characteristics cannot be obtained.

SUMMARY OF THE INVENTION

Accordingly, in view of the aforementioned problems, the present invention has an objective to provide a light receiving amplification circuit which has a gain switching function and in which it is further possible to easily design a circuit that has a desirable gain.

To solve the abovementioned problems, the light receiving amplification in the present invention includes: a light receiving element; an amplification circuit, having an amplification stage for external output and a plurality of amplification stages for feedback, and which amplifies a photoelectric current generated by said light receiving element; a plurality of gain selection switches, each being set in the respective plurality of amplification stages for feedback, and each causing the corresponding amplification stage to deactivate by interrupting an operating current; and a plurality of gain resistors, each being connected between the respective plurality of amplification stages for feedback and an input of said amplification circuit.

In addition, the light receiving amplification circuit may further include a plurality of operating current sources, each being set in the amplification stage for external output and each of the plurality of amplification stages for feedback, and each supplying an operating current to the corresponding amplification stage, wherein each one of the plurality of gain selection switches is operable to deactivate a corresponding stage by interrupting the operating current from the operating current source, and each one of the plurality of gain resistors may be connected between an operating current source side of the corresponding gain selection switch and the input of the amplification circuit.

In addition, each of the gain selection switches may include: a selector switch element, connected between the corresponding amplification stage and the operating current source; a control current source, which turns the selector switch element on by supplying a constant control current, and a control switch, which turns the selector switch element off by interrupting the control current.

In addition, the light receiving amplification circuit may further include a compensatory switch element which has the same size and same characteristic as the selector switch element, is connected between the amplification stage for external output and an operating current source, and is continually on.

In addition, the amplification circuit may output a voltage which is a sum of a reference voltage and a differential voltage depending on the photoelectric current, and the light receiving amplification circuit may further include: a compensatory switch element which has the same size and same characteristics as the selector switch element and is continuously on; and a level shift circuit operable to cause the reference voltage to level-shift in an amount of voltage arising in the compensatory switch element.

In addition, the gain resistors may be connected in series forming a series circuit, one end of the series circuit being connected to an input of said amplification circuit, and a connection point between the gain resistors and the other end of the series circuit being connected to one of said gain selection switches.

In addition, an input amplification stage of the amplification circuit may be a differential amplification circuit, with the light receiving element connected to an amplification element set in one side of the input amplification stage, and with a reference voltage applied to an amplification element set in the other side, and the light receiving amplification circuit may further include: an amplification element for compensation amount detection, which has the same size and same characteristics of the amplification element of the input amplification stage, and which is connected in series to an amplification element to which said light receiving element is connected; and a current mirror circuit, operable to inject a current into an input of an amplification element to which said light receiving element is connected, the current being of the same amount as an input current of said amplification element for compensation amount detection.

In addition, an input amplification stage of the amplification circuit may be a differential amplification circuit, with the light receiving element connected to an amplification element set in one side of the input amplification stage, and with a reference voltage applied to an amplification element set in the other side, and the light receiving amplification circuit may further include: an amplification element for compensation amount detection, which has the same size and same characteristics of the amplification element of the input amplification stage, and which is connected in series to an amplification element the reference voltage is applied to; and a current mirror circuit, operable to inject a current into an input of an amplification element which said light receiving element is connected to, the current being of the same amount as an input current of said amplification element for compensation volume detection.

According to the present invention, by inserting a gain selection switch into the amplification stage of an operational amplifier circuit, the gain of the operational amplifier circuit is determined by only the gain resistor value and the current flowing into the gain resistor, without being influenced by the voltage arising in the gain selection switch. Therefore, the design of a circuit for obtaining desirable characteristics is greatly streamlined. Additionally, offset arising in the output can be reduced simply by setting a compensatory switch. As further information about technical background to this application, the disclosure of Japanese Patent Application No. 2004-334146 filed on Nov. 18, 2004 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT(S)

The embodiments of the present invention are described below with reference to the diagrams.

First Embodiment

Figure 1:
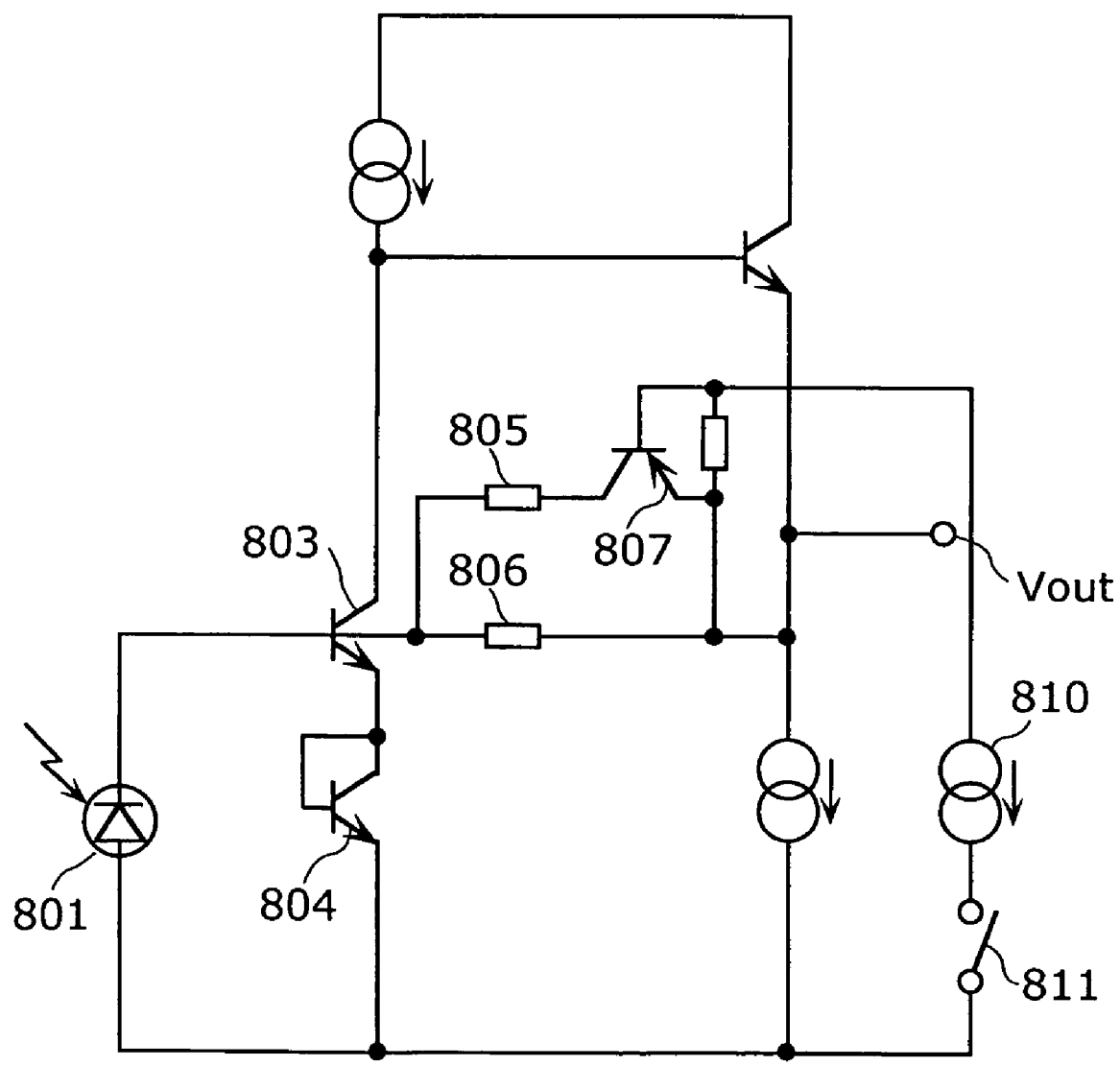
FIG. 1 is a circuit diagram showing a light receiving amplification circuit using a PNP transistor found in conventional art.
Figure 2:
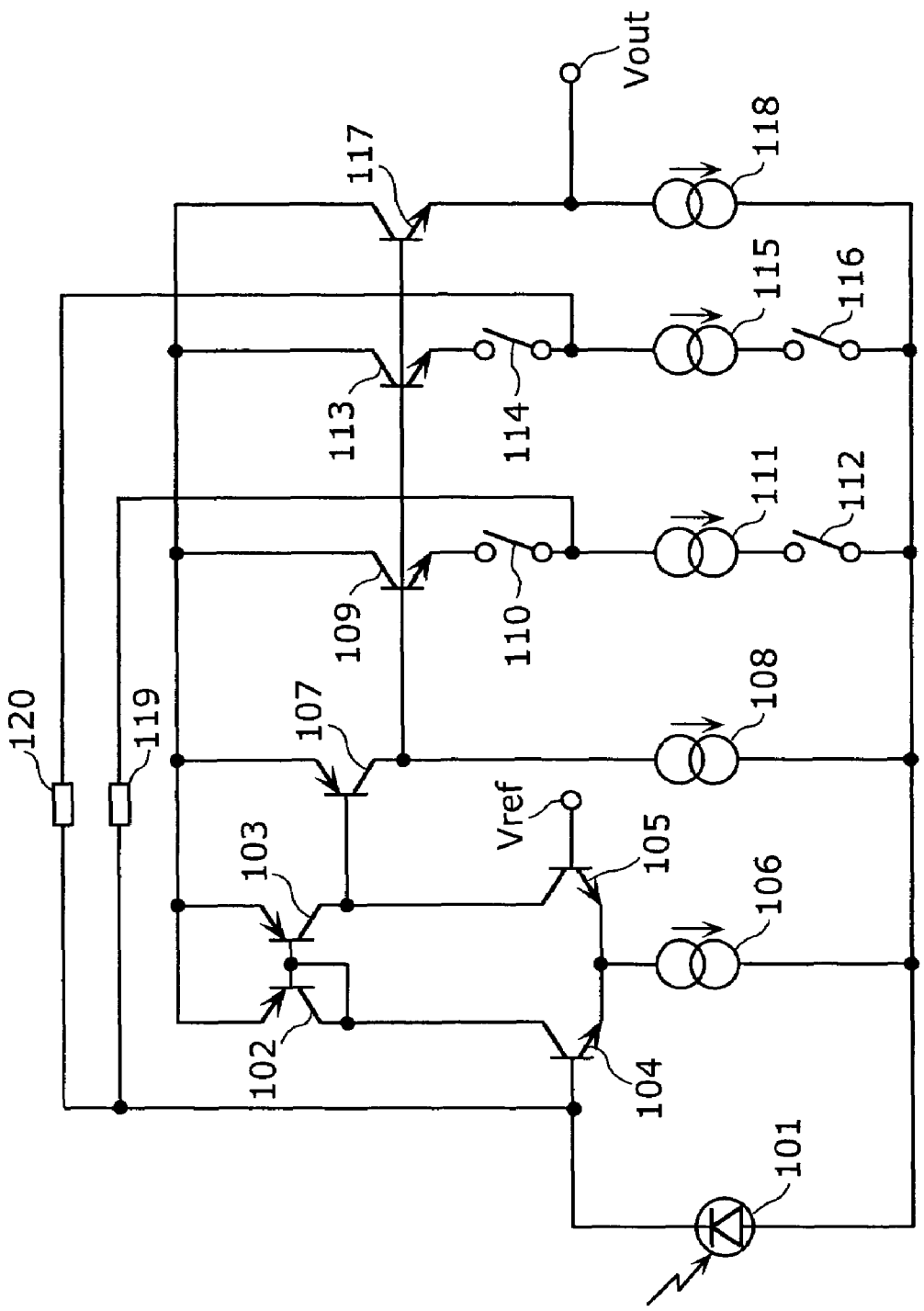
FIG. 2 is a circuit diagram showing one example of a light receiving amplification circuit in the first embodiment of the present invention.

FIG. 2 is a circuit diagram showing a light receiving amplification circuit in the first embodiment of the present invention.

First, as shown in FIG. 2, in a differential amplification circuit configured from NPN transistors 104 and 105, PNP transistors 102, 103, and 107, and constant current sources 106 and 108, a cathode of a light receiving element 101 is connected to a base of the NPN transistor 104, and is further connected to one end of gain resistors 119 and 120. Additionally, a reference voltage Vref is applied to a base of the NPN transistor 105.

Each of the other ends of gain resistors 119 and 120 are connected to emitters of the NPN transistors 109 and 113 via gain selection switches 110 and 114, and respective bases of the NPN transistors 109 and 113 are connected to a collector of the PNP transistor 107.

The respective emitters of the NPN transistors 109 and 113 are connected to one end of constant current sources 111 and 115 via the switches 110 and 114, and switches 112 and 116 are connected to the other ends of the constant current sources 111 and 115. The constant current sources 111 and 115 are turned on/off by the switches 112 and 116.

In addition, the collector of the PNP transistor 107 is connected to a base of an NPN transistor 117, and an emitter of the NPN transistor 117 is connected to a constant current source 118.

In this circuit, an operational amplifier circuit is configured from the differential amplification circuit, the NPN transistors 109, 113, and 117, the switches 110, 112, 114, and 116, and the constant current sources 111, 115, and 118. This operational amplifier circuit is an example of the amplification circuit as mentioned in the Claims. The NPN transistor 117 is an amplification stage used in an external output in this operational amplifier, and the NPN transistors 109 and 113 are amplification stages used in a feedback in this operational amplifier. Additionally, the constant current sources 111, 115, and 118 are examples of an operating current source, and the switches 110 and 114 are examples of a gain selection switch.

In this circuit, the potential at the emitter of the NPN transistor 117 is the output Vout of this operation amplifier circuit.

The operation of the present circuit is described below.

In the case where the switches 110 and 112 are turned on and the switches 114 and 116 are turned off, the stages used in feedback including the NPN transistor 109 operate, and the gain resistor 119 is selected as the gain resistor of the operational amplifier circuit. In the case where the switches 110 and 112 are turned off and the switches 114 and 116 are turned on, the stages used in feedback including the NPN transistor 113 operate, and the gain resistor 120 is selected as the gain resistor of the operational amplifier circuit.

When the gain resistor 119 or 120 is selected, photoelectric current generated by the light receiving element 101 flows through the selected gain resistor, and the voltage arising at the end of each gain resistor is caused to be applied to the input of the operational amplifier circuit and is reflected in the output of the operational amplifier.

According to the first embodiment, unlike conventional art, a switching transistor is not set in series next to a gain resistor. Rather, gain switching is executed with a switch set in the amplification stage used in feedback of the operational amplifier circuit. Therefore, the influence of a switch and the like upon the characteristics of the operational amplifier can be greatly reduced and designing gain resistor can be easily executed, since a saturation voltage Vce (sat) of a transistor used for switch selection is not added to the input of the operational amplifier circuit.

In addition, when adjusting the dynamic range of the light receiving signal through switching of the gain resistor, it is possible to suppress deviation from a range's set value, and a light receiving amplification circuit with favorable characteristics can be designed.

Second Embodiment

Figure 3:
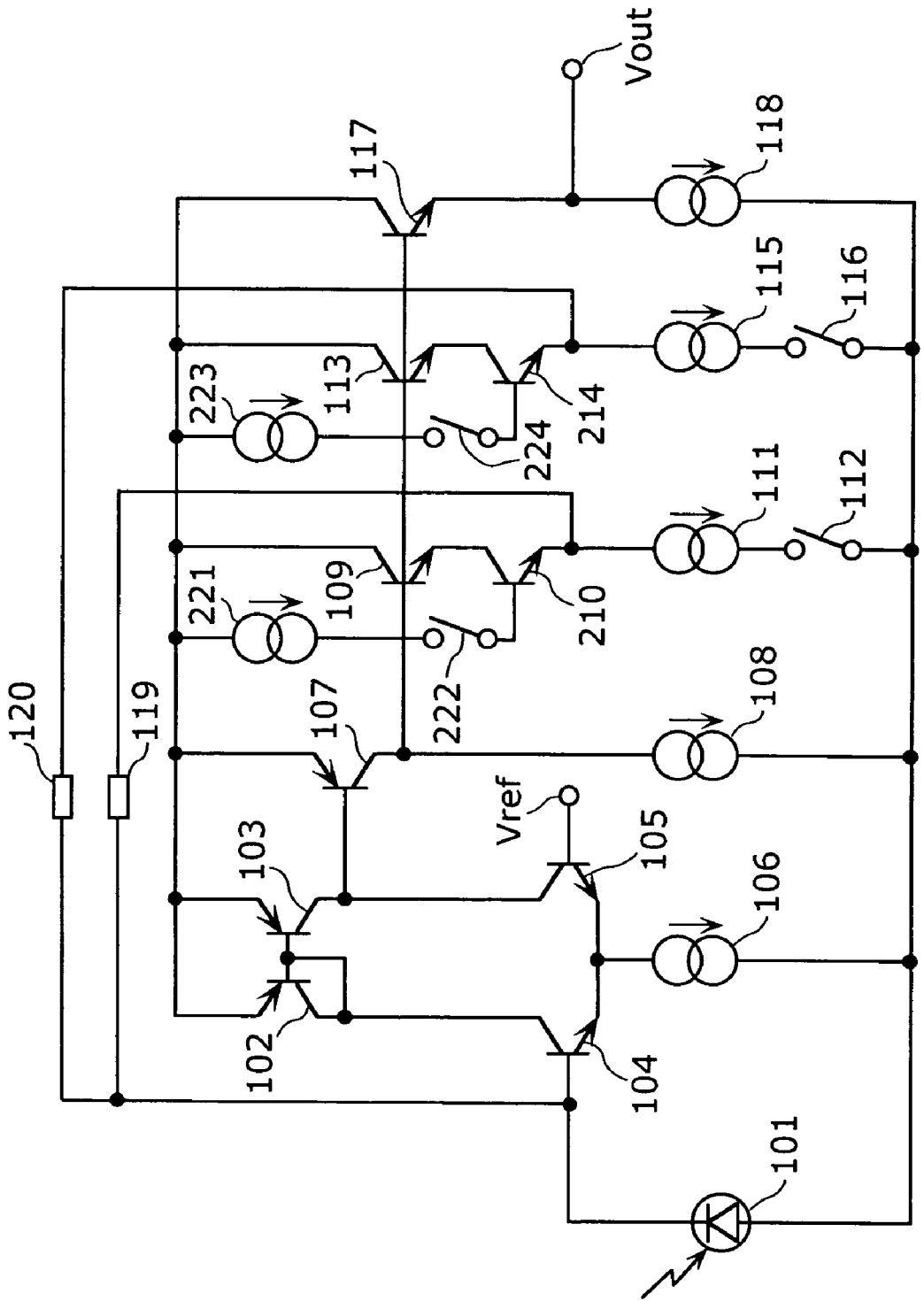
FIG. 3 is a circuit diagram showing one example of a light receiving amplification circuit in the second embodiment of the present invention.

FIG. 3 is a circuit diagram showing a light receiving amplification circuit in the second embodiment of the present invention.

As shown in FIG. 3, the present embodiment has a configuration which uses NPN transistors 210 and 214 in place of switches 110 and 114 in the first embodiment, and constant current sources 221 and 223 and switches 222 and 224 are connected to respective bases of the NPN transistors 210 and 214.

Here, the NPN transistors 210 and 214 are an example of a selector switch element as mentioned in the Claims; the constant current sources 221 and 223 are an example of a control current source; and the switches 222 and 224 are an example of a control switch.

In the case where switches 112 and 222 are turned on and switches 116 and 224 are turned off, the NPN transistor 210 is on and a gain resistor 119 is selected as the gain resistor of the operational amplifier circuit.

In the case where the switches 112 and 222 are turned off and the switches 116 and 224 are turned on, the NPN transistor 214 is on and a gain resistor 120 is selected as the gain resistor of the operational amplifier circuit.

When the gain resistor 119 or 120 is selected, a photoelectric current generated by a light receiving element 101 flows through the selected gain resistor, the voltage arising at the end of each gain resistor is caused to be applied to the input of the operational amplifier circuit, and is reflected in the output of the operational amplifier.

According to the second embodiment, as in the first embodiment, a switching transistor is not set in series next to a gain resistor. Rather, gain switching is executed with a switch set in the amplification stage used in feedback of the operational amplifier circuit. Therefore, the influence of a switch and the like upon the characteristics of the operational amplifier can be greatly reduced and designing gain resistor can be easily executed, since a saturation voltage Vce (sat) of a transistor used for switch selection is not added to the input of the operational amplifier circuit.

Particularly in the present invention, an NPN transistor is used as a gain switching switch set in an amplification stage used in feedback, and as a constant current is supplied to the base of that NPN transistor, the following points are advantageous.

That is, because the base current is constant, the Vce (sat) arising when the NPN transistor operates also stabilizes, and as a result, the potential at the emitter of transistors 109 and 113 of the amplification stage used in feedback also stabilizes. Therefore, the influence exerted on the operation of the operational amplifier by the NPN transistor used for gain selection can be reduced. Furthermore, by using the NPN transistor, the response speed as a switch can be increased, and therefore high-speed operation of the circuit becomes possible. Additionally, because much more operation current can be obtained than with a PNP transistor of the same size, the switch can be made smaller, and consequently, the area of the circuit can be reduced.

In addition, as in the first embodiment, when adjusting the dynamic range of the light receiving signal through switching of the gain resistor, it is possible to suppress a deviation from a range's set value, and a light receiving amplification circuit with favorable characteristics can be designed.

Third Embodiment

Figure 4:
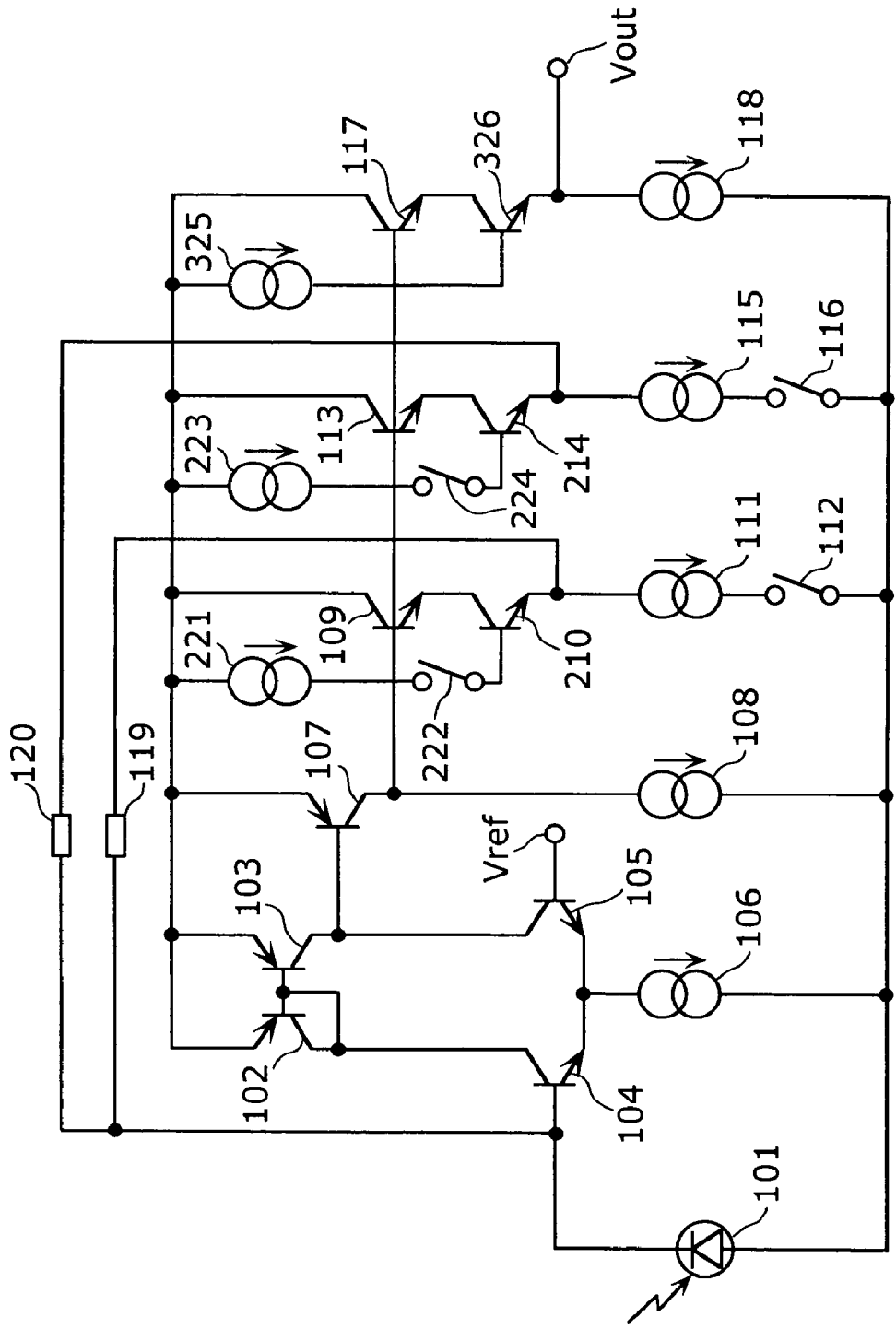
FIG. 4 is a circuit diagram showing one example of a light receiving amplification circuit in the third embodiment of the present invention.

FIG. 4 is a circuit diagram showing a light receiving amplification circuit in the third embodiment of the present invention.

As shown in FIG. 4, the present embodiment differs from the configuration of the second embodiment in that: an NPN transistor 326 of the same size and characteristics as NPN transistors 210 and 214 used in gain selection is placed between an output terminal of an operational amplifier circuit and an NPN transistor 117 connected in series to the output terminal; and a constant current source 325 is connected to a base of the NPN transistor 326.

Here, the NPN transistor 326 is an example of a compensatory switch element as mentioned in the Claims and is continuously on due to the base current from the constant current source 325.

In the configuration disclosed in the second embodiment, a Vce (sat) voltage arising when an NPN transistor 210 or 214 used in gain selection is turned on, the output of the operational amplifier circuit is increased, and as a result, an offset occurs in the output. Depending on the circuit's specifications, this offset current can be an operational problem, but according to the configuration disclosed in the present embodiment, keeping the NPN transistor 326 continuously on causes the Vce (sat) arising in the NPN transistor 210 or 214 used in gain selection to be cancelled, which makes reducing the output offset voltage of the operational amplifier circuit possible. Through this, the characteristics of the light receiving amplification circuit can be further enhanced.

Furthermore, it goes without saying that the present embodiment has the same effects as the first and second embodiments.

Fourth Embodiment

Figure 5:
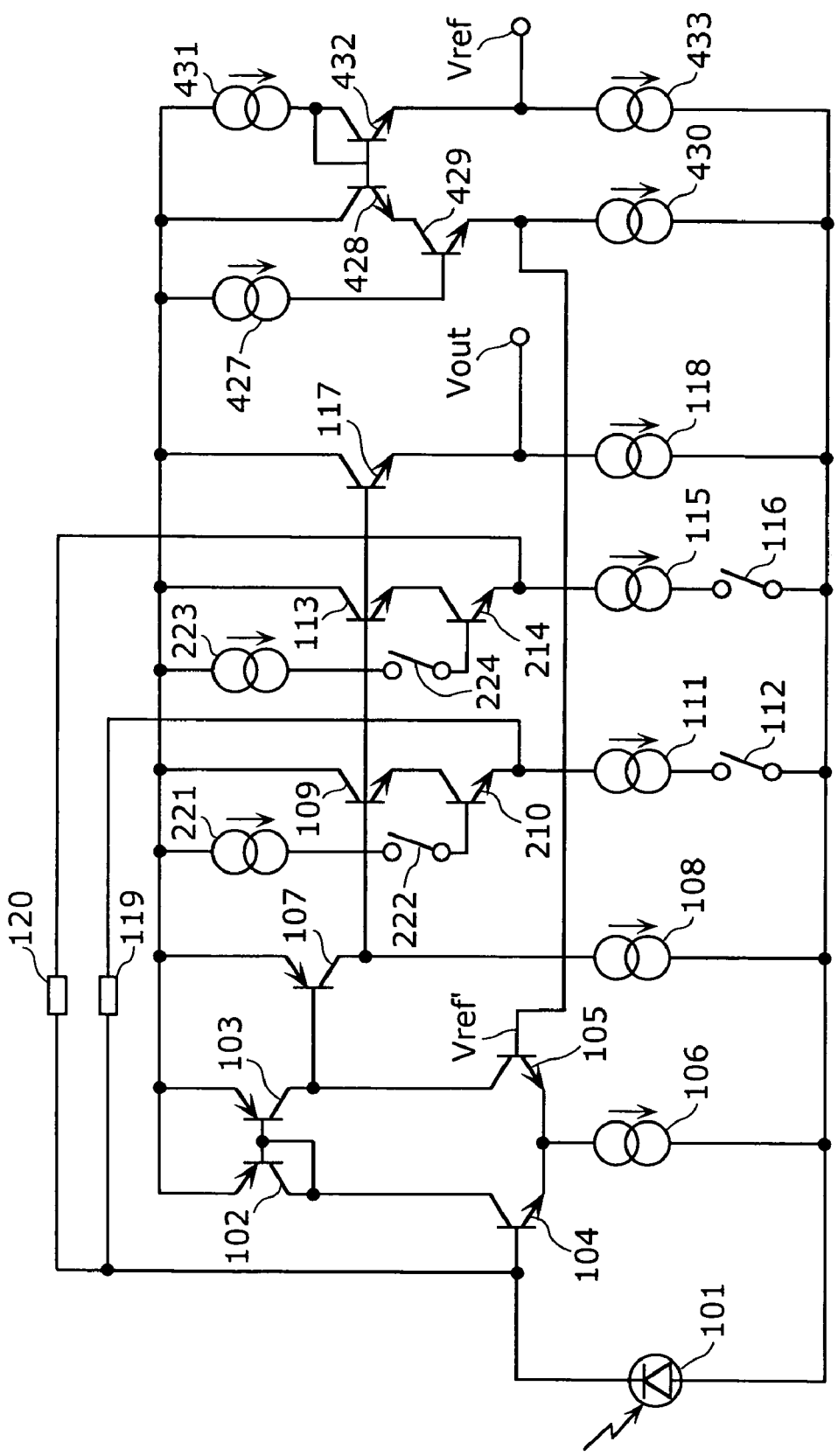
FIG. 5 is a circuit diagram showing one example of a light receiving amplification circuit in the fourth embodiment of the present invention.

FIG. 5 is a circuit diagram showing a light receiving amplification circuit in the fourth embodiment of the present invention.

As shown in FIG. 5, the present embodiment differs from the configuration of the second embodiment in that an NPN transistor 429 of the same size and characteristics of NPN transistors 210 and 214, and a circuit that level-shifts a reference voltage Vref in the amount of a Vce (sat) voltage arising in the NPN transistor 429, are set.

An emitter of the NPN transistor 429 is connected to a base of an NPN transistor that is one input terminal of an operational amplifier circuit. Additionally, a constant current source 427 is connected to the base of the NPN transistor 429 and is continually on.

Furthermore, an emitter of an NPN transistor 428 is connected to a collector of the NPN transistor 429, a base of the NPN transistor 428 is connected to a base of an NPN transistor 432, and a collector of the NPN transistor 428 is connected to a source voltage Vcc. The reference voltage Vref is applied to an emitter of the NPN transistor 432, and a constant current source 431 is connected to a collector common-connected to a base of the NPN transistor 432.

A circuit configured from these NPN transistors 428 and 431 and the constant current source 431 is an example of a level shift circuit, and the NPN transistor 429 is an example of a compensatory switch element.

Here, a relationship between the potential at the emitter of the NPN transistor 429 and the reference voltage Vref in the present embodiment is explained.

The reference voltage Vref is applied to the emitter of the NPN transistor 432. The base of the NPN transistor 432 and the base of the NPN transistor 428 are common-connected, and because a constant current is supplied to the bases from the constant current source 431, the potential at the emitter of the NPN transistor 428 and the potential at the emitter of the NPN transistor 432 are the same electric potential.

This being so, the potential at the emitter of the NPN transistor 429 is an electric potential Vref', less than the Vref by the amount of the saturation collector-to-emitter voltage Vce (sat) of the NPN transistor 429.

Therefore, according to the present embodiment, the effectual reference voltage applied to the operational amplifier circuit is the electrical potential Vref', which is less than the electric potential of the reference voltage Vref by the amount of the Vce (sat) voltage of the NPN transistor 429. Therefore, an increase in the output electric potential and generation of offset caused by the Vce (sat) voltage arising when the NPN transistors 210 or 214 used in gain selection are turned on is cancelled by causing the electric potential for a reference to drop by the Vce (sat), and an output offset voltage of the operational amplifier circuit can be reduced.

In addition, in the case where respective operational amplifier circuits are set in a plurality of light receiving elements, by setting a circuit which cancels the Vce (sat) voltage from the reference voltage per se, one cancel circuit can respond to all operational amplifier circuits at the same time. Therefore, the overall number of transistor elements can be reduced, and miniaturization of the circuit can be achieved.

Note that it goes without saying that the same effect achieved by the configuration in the first and second embodiments can be achieved in the present embodiment.

Fifth Embodiment

Figure 6:
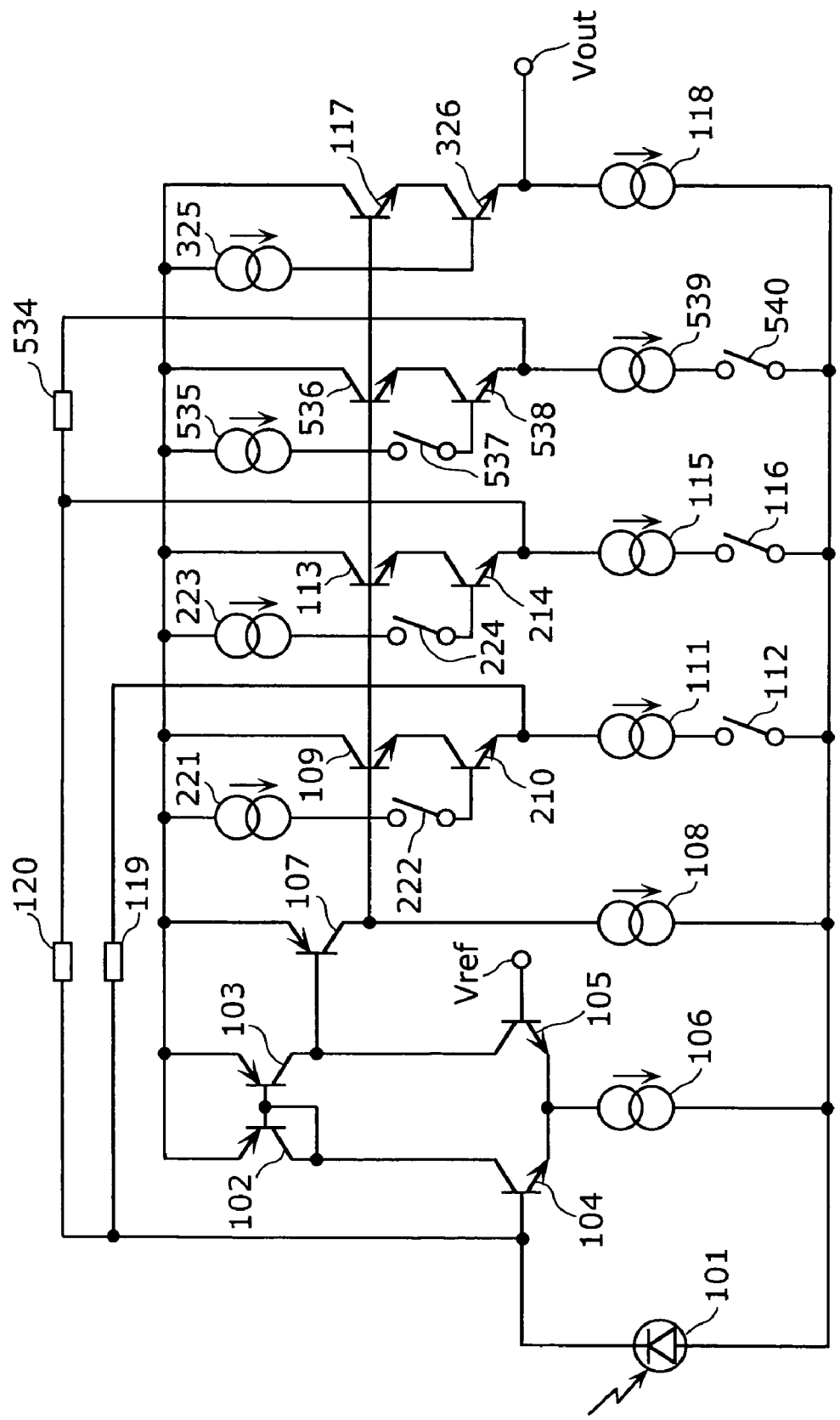
FIG. 6 is a circuit diagram showing one example of a light receiving amplification circuit in the fifth embodiment of the present invention.

FIG. 6 is a circuit diagram showing a light receiving amplification circuit in the fifth embodiment of the present invention.

As shown in FIG. 6, the present embodiment differs from the configuration of the second embodiment in the following points: a gain resistor 534 is connected in series to a gain resistor 120; and an NPN transistor 538 used for gain selection is connected to the gain resistor 534 in the same manner as with gain resistors 119 and 120.

In the present embodiment, a gain resistor is selected through the following operation.

In the case where switches 112 and 222 are turned on and switches 116, 224, 537, and 540 are turned off, an NPN transistor 210 is turned on and the gain resistor 119 is selected as the gain resistor of an operation amplifier circuit.

In the case where the switches 116 and 224 are turned on and the switches 112, 222, 537, and 540 are turned off, an NPN transistor 214 is turned on and the gain resistor 120 is selected as the gain resistor of the operational amplifier circuit.

In the case where the switches 537 and 540 are turned on and the switches 112, 222, 116, and 224 are turned off, the NPN transistor 538 is turned on and the sum of the gain resistor 120 and the gain resistor 534 is selected as the gain resistor of the operational amplifier circuit.

When the gain resistor 119, the gain resistor 120, or the gain resistor determined by the sum of the gain resistor 120 and the gain resistor 534 is selected, photoelectric current generated by the light receiving element 101 flows through the selected gain resistor, the current arising at the end of each gain resistor is caused to be applied to the input of the operational amplifier circuit, and is reflected in the output of the operational amplifier.

According to the present embodiment, gain resistors are configured in series and the configuration carries out gain switching, and when the configuration is set so that each gain resistor value is added together and the total is the maximum gain resistor value, it is possible to design each gain resistor value to be small, hence reducing the overall resistor area.

Note that it goes without saying that the same effect achieved by the configuration in the first and second embodiments can be achieved in the present embodiment.

Sixth Embodiment

Figure 7:
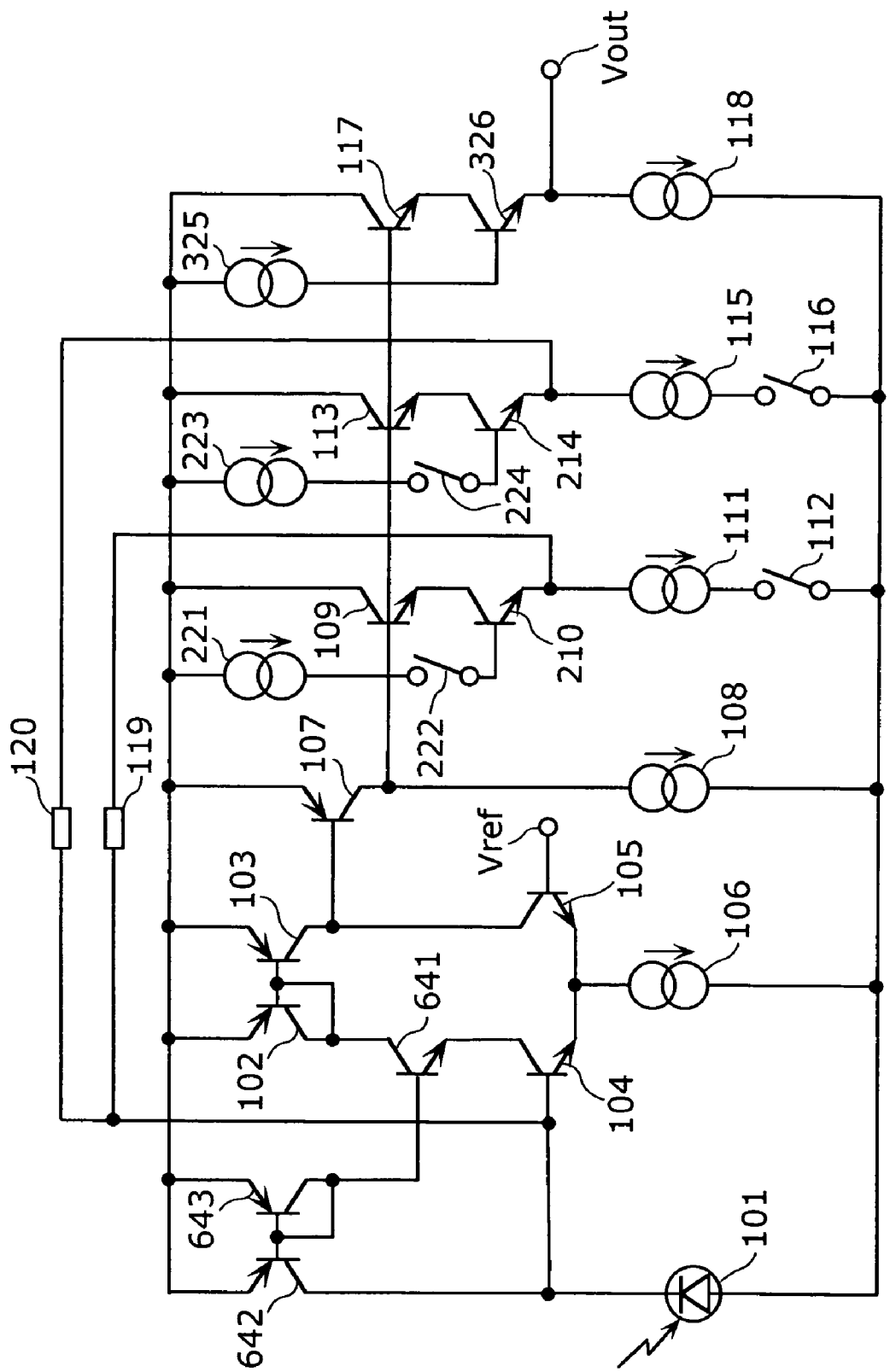
FIG. 7 is a circuit diagram showing one example of a light receiving amplification circuit in the sixth embodiment of the present invention.

FIG. 7 is a circuit diagram showing a light receiving amplification circuit in the sixth embodiment of the present invention.

As shown in FIG. 7, the present embodiment differs from the configuration of the third embodiment in the following points: an NPN transistor 641 of the same characteristics and size of an NPN transistor 104 is connected between PNP transistor 102 and the NPN transistor 104; and a current mirror circuit made up of PNP transistors 642 and 643 is connected between a base of the NPN transistor 641 and a cathode of a light receiving element 101.

Here, the NPN transistor 641 is one example of an compensatory amount detective amplification element as mentioned in the Claims.

The NPN transistors 104 and 105 of a differential amplification circuit are in a balanced state in the initial state (a state with no input signal), and each base current has the same amount. A collector current of the NPN transistor 104 is an emitter current of the NPN transistor 641, and a base current of the NPN transistor 641 has almost the same amount as the base current of the NPN transistor 104. The PNP transistor 642 of the current mirror circuit injects a current of the same amount as the base current of the NPN transistor 641 into the base of the NPN transistor 104.

In the case where there is no NPN transistor 641 and no current mirror circuit, the base current of the NPN transistor 104 in the initial state flows through a gain resistor 119 or 120, and through this, a voltage drop occurs, and an offset voltage occurs.

On the other hand, according to the present embodiment, a current of the same size as the base current of the NPN transistor 104 flows toward the base of the NPN transistor 104 from the NPN transistor 641. Therefore, the abovementioned voltage drop in the gain resistor is cancelled, and reducing the offset voltage in the operational amplifier circuit is possible.

Note that it goes without saying that the same effect achieved by the configuration in the first to third embodiments can be achieved in the present embodiment.

Seventh Embodiment

Figure 8:
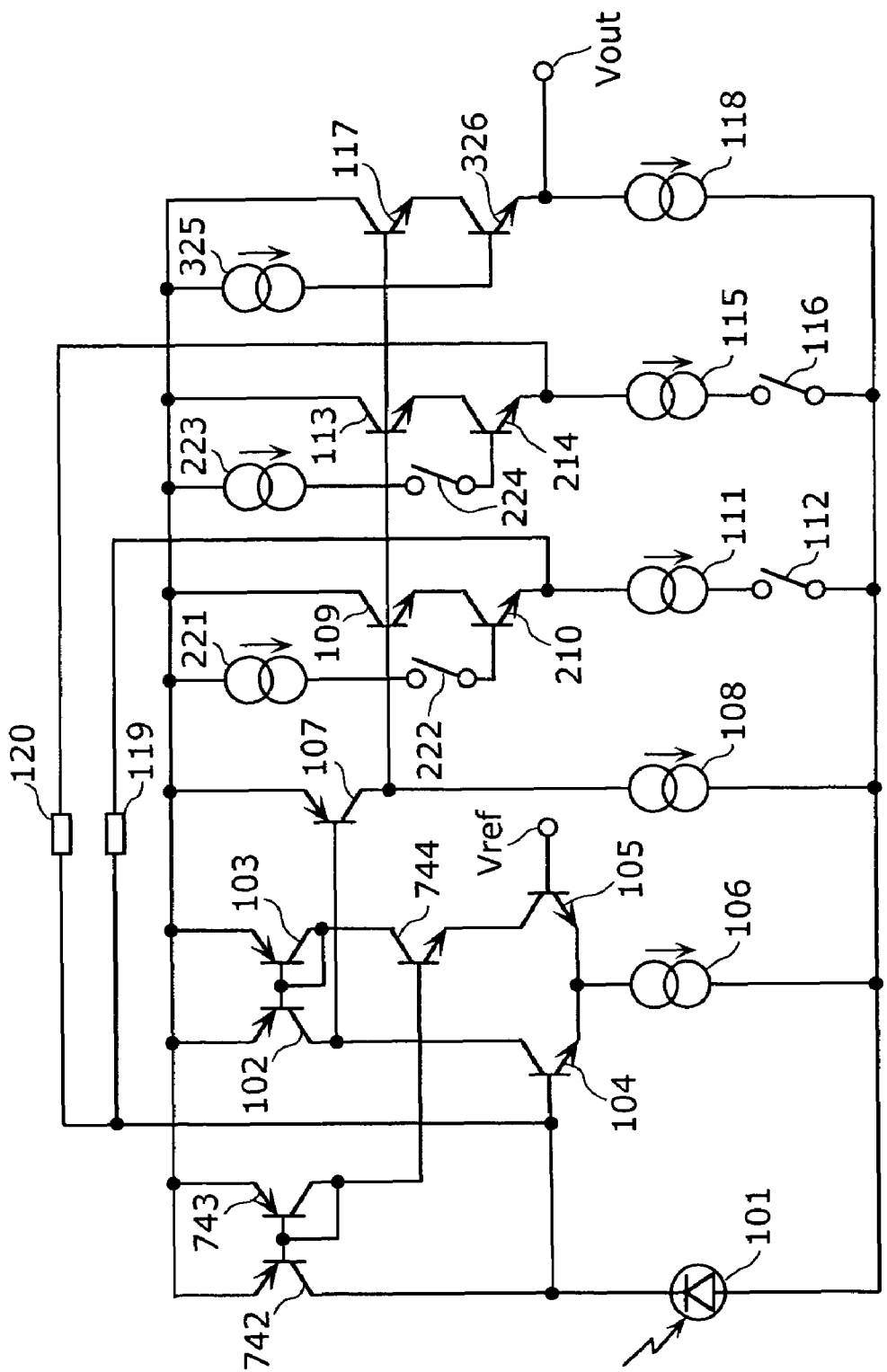
FIG. 8 is a circuit diagram showing one example of a light receiving amplification circuit in the seventh embodiment of the present invention.

FIG. 8 is a circuit diagram showing a light receiving amplification circuit in the seventh embodiment of the present invention.

As shown in FIG. 8, the present embodiment differs from the configuration of the third embodiment in the following points: an NPN transistor 744 of the same characteristics and size as an NPN transistor 105 is connected between a PNP transistor 103 and the NPN transistor 105; and a current mirror circuit made up of PNP transistors 742 and 743 is connected between a base of the NPN transistor 744 and a cathode of a light receiving element 101.

Here, the NPN transistor 744 is one example of an amplification element used in compensatory amount detection as mentioned in the Claims.

NPN transistors 104 and 105 of a differential amplification circuit are in a balanced state in the initial state (a state with no input signal), and each base current has the same amount. A collector current of the NPN transistor 105 is an emitter current of the NPN transistor 744, and a base current of the NPN transistor 744 has almost the same amount as the base current of the NPN transistor 104. The PNP transistor 742 of the current mirror circuit injects a current of the same amount as the base current of the NPN transistor 744 into the base of the NPN transistor 104.

In the case where there is no NPN transistor 744 and no current mirror circuit, the base current of the NPN transistor 104 in the initial state flows through a gain resistor 119 or 120, and through this, a voltage drop occurs, and an offset voltage occurs.

However, according to the present embodiment, a current of the same size as the base current of the NPN transistor 104 flows toward the base of the NPN transistor 104 from the NPN transistor 744. Therefore, the abovementioned voltage drop in the gain resistor is cancelled, and reducing the offset voltage in the operational amplifier circuit is possible.

In addition, according to the present embodiment, a current equivalent to the base current of the NPN transistor 105 on the reference side of the differential amplification circuit is injected into the base of the NPN transistor 104 on the input side. Therefore, negative feedback is applied, and saturation of the differential amplification circuit can be prevented, and a light receiving amplification circuit with even more favorable characteristics can be designed.

Note that it goes without saying that the same effect achieved by the configuration in the first, second, and third embodiments can be achieved in the present embodiment.

(Closing)

As described in the above embodiments, according to the light receiving amplification circuit of the present invention, by using an operational amplifier circuit which has an amplification stage for external output and a plurality of amplification stages for feedback, and by inserting a gain selection switch which causes the amplification stages for feedback to deactivate, the gain of the operational amplifier circuit is determined by the gain resistor value and the current that flows through the gain resistor, without being influenced by the voltage arising in the gain selection switch. Therefore, the design of a circuit for obtaining desirable characteristics is greatly streamlined. Additionally, offset arising in the output can be reduced simply by setting a compensatory switch.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The light receiving amplification circuit according to the present invention is particularly useful in an optical pickup apparatus, as a light receiving circuit that features a function to switch the gain depending on the level of an input signal.

What is claimed is:

1. A light receiving amplification circuit comprising:
    a light receiving element;
    an amplification circuit, having an amplification stage for external output and a plurality of amplification stages for feedback, and operable to amplify a photoelectric current generated by said light receiving element;
    a plurality of gain selection switches, each being set in the respective plurality of amplification stages for feedback, and each operable to cause the corresponding amplification stage to deactivate by interrupting an operating current; and
    a plurality of gain resistors, each being connected between the respective plurality of amplification stages for feedback and an input of said amplification circuit.

2. The light receiving amplification circuit according to claim 1, further comprising
    a plurality of operating current sources, each being set in the amplification stage for external output and each of the plurality of amplification stages for feedback, and each operable to supply an operating current to the corresponding amplification stage,
    wherein each one of said plurality of gain selection switches is operable to deactivate a corresponding stage by interrupting the operating current from said operating current source, and
    each one of said plurality of gain resistors is connected between an operating current source side of the corresponding gain selection switch and the input of said amplification circuit.

3. The light receiving amplification circuit according to claim 2,
    wherein each said gain selection switch includes:
    a selector switch element, connected between the corresponding amplification stage and the operating current source;
    a control current source, operable to turn said selector switch element on by supplying a constant control current, and
    a control switch, operable to turn said selector switch element off by interrupting the control current.

4. The light receiving amplification circuit according to claim 3, further comprising
    a compensatory switch element which has the same size and same characteristic as said selector switch element, is connected between the amplification stage for external output and an operating current source, and is continually on.

5. The light receiving amplification circuit according to claim 3,
wherein said amplification circuit is operable to output a voltage which is a sum of a reference voltage and a differential voltage depending on the photoelectric current, and
said light receiving amplification circuit further comprises:
a compensatory switch element which has the same size and same characteristics as said selector switch element and is continuously on; and
a level shift circuit operable to cause the reference voltage to level-shift in an amount of voltage arising in said compensatory switch element.

6. The light receiving amplification circuit according to claim 1,
wherein said gain resistors are connected in series forming a series circuit, one end of the series circuit is connected to an input of said amplification circuit, and (a) a connection point between the gain resistors and (b) the other end of the series circuit are both connected to one of said gain selection switches.

7. The light receiving amplification circuit according to claim 1,
wherein an input amplification stage of said amplification circuit is a differential amplification circuit, and said light receiving element is connected to an amplification element set in one side of the input amplification stage, and a reference voltage is applied to an amplification element set in the other side, and
said light receiving amplification circuit further comprises:
an amplification element for compensation amount detection, which has the same size and same characteristics of the amplification element of the input amplification stage, and which is connected in series to an amplification element to which said light receiving element is connected; and
a current mirror circuit, operable to inject a current into an input of an amplification element to which said light receiving element is connected, the current being of the same amount as an input current of said amplification element for compensation amount detection.

8. The light receiving amplification circuit according to claim 1,
wherein an input amplification stage of said amplification circuit is a differential amplification circuit, and said light receiving element is connected to an amplification element set in one side of the input amplification stage, and a reference voltage is applied to an amplification element set in the other side, and
said light receiving amplification circuit further comprises:
an amplification element for compensation amount detection, which has the same size and same characteristics of the amplification element of the input amplification stage, and which is connected in series to an amplification element the reference voltage is applied to; and
a current mirror circuit, operable to inject a current into an input of an amplification element which said light receiving element is connected to, the current being of the same amount as an input current of said amplification element for compensation volume detection.

* * * * *